United States Patent [19]

Kovář et al.

[11] 4,104,677
[45] Aug. 1, 1978

[54] ARRANGEMENT FOR ADJUSTABLY URGING A SEMI-CONDUCTIVE ELEMENT AGAINST A HEAT SINK

[75] Inventors: Jiří Kovář; Pavel Kafuněk; Pavel Reichel; Oldřich Pokorný; Michal Pellant; Jindřich Kratina; Jaroslav Zůna, all of Prague, Czechoslovakia

[73] Assignee: CKD Praha, oborový podnik, Prague, Czechoslovakia

[21] Appl. No.: 745,201

[22] Filed: Nov. 26, 1976

[30] Foreign Application Priority Data

Nov. 28, 1975 [CS] Czechoslovakia ............ 8082-75

[51] Int. Cl.² .............. H01L 23/02; H01L 23/48; H01L 29/44
[52] U.S. Cl. ...................... 357/81; 357/79; 357/68; 174/52 S; 165/80
[58] Field of Search .............. 357/7, 9, 81, 68; 174/52 S; 165/80

[56] References Cited

U.S. PATENT DOCUMENTS

| 3,226,466 | 12/1965 | Martin | 357/81 |
|---|---|---|---|
| 3,436,603 | 4/1969 | Vogt | 357/81 |
| 3,467,897 | 9/1969 | Hoffmann et al. | 357/81 |
| 3,624,452 | 11/1971 | Hayward | 357/81 |
| 3,688,159 | 8/1972 | Robbins | 357/81 |
| 3,715,632 | 2/1973 | Warburton | 357/81 |
| 3,743,893 | 7/1973 | Yamomoto | 357/81 |
| 3,808,471 | 4/1974 | Grandia | 357/81 |

FOREIGN PATENT DOCUMENTS 439,034  1/1975  U.S.S.R. .................. 357/81

Primary Examiner—Andrew J. James

[57] ABSTRACT

A flat surface of a planar power semiconductive element, such as a thyristor or diode, is adjustably urged downwardly against a heat sink in electrical and thermal contact therewith by means of a spring-loaded eccentric element. The spring extends transversely over the opposite surface of the semiconductive element between a pair of anchor members carried by the heat sink. The eccentric is secured to an intermediate portion of the transversely extending spring, and is adapted to rotate in a vertical plane whereby successive portions of the eccentric periphery are urged with different pressures downwardly against the opposed surface of the semiconductive element, either directly or through an insulating spacer element. If desired, a pair of flattened abutment areas may be established on diametrically opposed portions of the eccentric periphery to correspondingly define a two-position stable adjustment of the bearing pressure.

7 Claims, 5 Drawing Figures

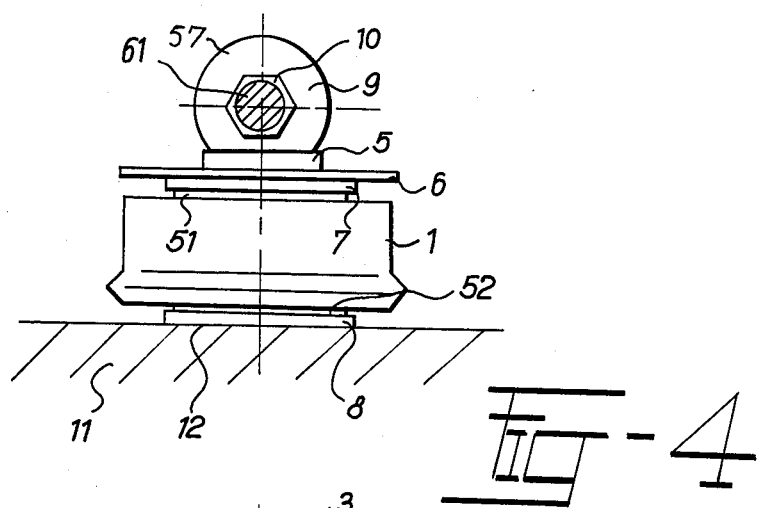
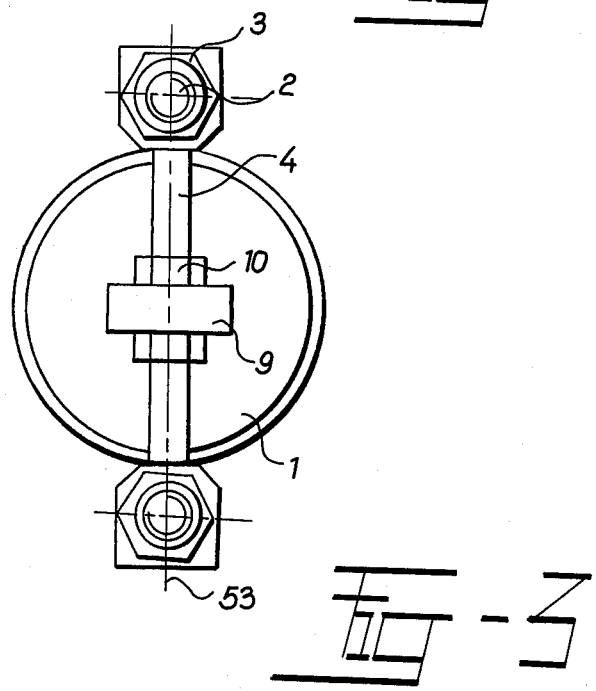
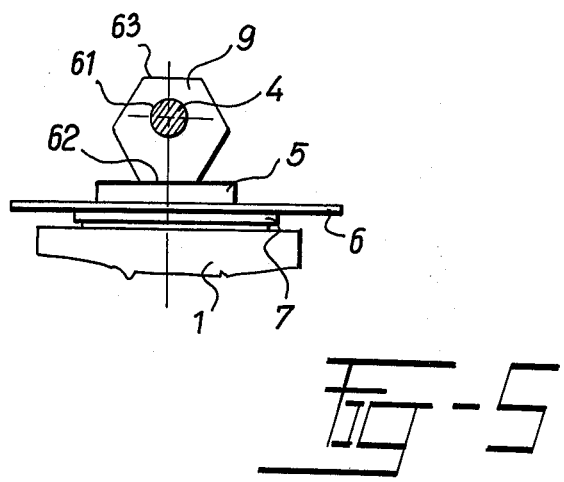

ARRANGEMENT FOR ADJUSTABLY URGING A SEMI-CONDUCTIVE ELEMENT AGAINST A HEAT SINK

BACKGROUND OF THE INVENTION

The invention relates to arrangements for urging a flat surface of a planar power semiconductive device against an underlying heat sink in good electrical and thermal contact therewith.

In known arrangements of this type, the semiconductive element, typically in the form of a round wafer or slice, is urged with a preferably pre-determined pressure against the heat sink by means of a biasing arrangement consisting of a stiff spring. In practice, it has been found that such spring severely limits the flexibility of the arrangement to adapt to wafers of differing materials and sizes, which correspondingly require different degrees of pressure for optimum thermal and electrical contact without the danger of breakage. In addition, the high localized force of the stiff spring against the wafer has been found to result in a progressively increasing unevenness of the force applied to the semiconductive element, thereby correspondingly decreasing the efficiency of the thermal and electrical contact.

SUMMARY OF THE INVENTION

These and other disadvantages of known arrangements for pressing a semiconductive element against a heat sink are avoided by the arrangement of the present invention. In an illustrative embodiment, a pair of anchor elements, such as extended bolts, are carried by the heat sink and extend on opposite sides thereof above the level of the semiconductive element to be pressed against the heat sink. An elongated biasing element, illustratively a steel spring, is carried by and extends between the opposed anchor elements above the level of the semiconductive element.

An eccentric disc or other member is affixed to an intermediate portion of the transversely extending spring, and is situated for rotation therewith in a vertical plane whereby the rotation of the eccentric by successive degrees from a rest position results in an increase in resistance against the biasing force of the spring. The periphery of the element is situated in contact with an insulating plate which in turn is arranged to contact the surface of the semiconductive element opposite to that in engagement with the heat sink, so that the semiconductive element is pressed downwardly with a force proportional to the contour of the eccentric element and the torsion-type restoring force of the spring on the eccentric element.

In order to assure a stable position of the ecccentric at a desired contact point, one or more regions of the eccentric periphery may be flattened at its point of engagement with the underlying insulating spacer. Alternatively, the insulating spacer may be dispensed with and the eccentric member itself formed from an insulating material for direct contact with the semiconductive element or with a conductive pad connected therewith.

Advantageously, a pair of diametrically opposed surfaces of the eccentric element, located at different distances from the spring axis around which the eccentric is disposed, may be provided for establishing a pair of stable positions for applying pre-determined bearing pressures on the semiconductive element.

In order to effect rotation of the eccentric element, an operating member such as a hexagonal bolt may be secured to such element; alternatively, the form factor of the eccentric itself may be made hexagonal, so that a separate operating element can be dispensed with.

BRIEF DESCRIPTION OF THE DRAWING

The invention is further set forth in the following detailed description taken in conjunction with the appended drawing, in which:

FIG. 3 is a plan view of the arrangement of FIG. 1;

FIG. 4 is a side view of an arrangement similar to FIG. 1 but having an alternative configuration of the spring biasing means and illustrating further details of the electrical and thermal connections between the semiconductive element, the heat sink, and the pressure-applying arrangement, respectively, with the outer anchor elements removed for purposes of clarity; and FIG. 5 is a side view, similar to FIG. 4, with certain details removed for clarity and employing a different configuration of the eccentric element.

DETAILED DESCRIPTION

Figure 1:
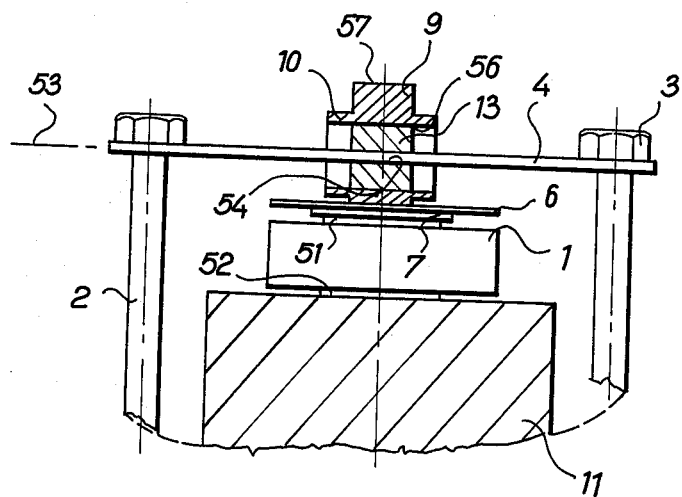
FIG. 1 is a front elevation, partially in section, of a first arrangement in accordance with the invention for pressing a planar semiconductive element against a heat sink with a variable pressure.

Referring now to the drawing, FIG. 1 illustrates a first arrangement in accordance with the invention for urging the transconductive path of a planar semiconductive element 1, illustratively a diode or thyristor, against a schematically illustrated heat sink 11 with an adjustable pressure determined by the characteristic of the element 1.

The element 1 is typically in the form of a wafer or slice whose thickness is exaggerated in the drawing.

The element 1 is provided with a first planar electrode 52 which is situated above and in contact with the heat sink 11, and an opposed planar electrode 51.

A pair of anchor members 2, in the form of vertically extending bolts, are carried on opposite sides of the heat sink 11 and terminate upwardly of the top planar electrode 51 of the element 1. A resilient member 4, illustratively in the form of a flat spring, extends transversely between the anchor members 2, and is secured at its respectively opposite ends to the members 2 by means of securing nuts 3 (FIG. 3). The spring 4, which may be made of steel, has a longitudinal axis 53.

A cylindrical element 13 having a longitudinal opening 54 extending therethrough is situated around the spring 4 above the plane of the electrode 51 of the element 1. An inner surface 56 of a hollow eccentric element 9 is in engagement with the outer surface of the element 13, so that the eccentric 9 is effectively secured to the spring 4 for rotation in a vertical plane as viewed in the drawing via the cylindrical element 13.

With such arrangement, the eccentric 9 is rotatable in the vertical plane against the biasing force of the spring 4, which is secured at its opposite ends to the anchor elements 2. During the rotation of the eccentric 9, as by suitable manipulation of an integral hexagonal fitting 10 integral therewith, a peripheral region 57 of the eccentric 9 will bear against the surface 51 of the element 1 with a pressing force which is determined by the instantaneous radial distance of the peripheral region 57 from the longitudinal axis 53 of the spring 4, and by the restoring force then exerted by the spring 4.

In the arrangement of FIG. 1, the eccentric 9 is assumed to be of conductive material. Therefore, an insulating spacer disc 6 is interposed between the peripheral region 57 of the eccentric 9 and a conductive pad 7, which in turn is secured to the planar electrode 51 of the semiconductive element. Alternatively, the eccentric 9 may be made of insulating material, in which case the insulating disc 6 may be dispensed with.

Figure 2:
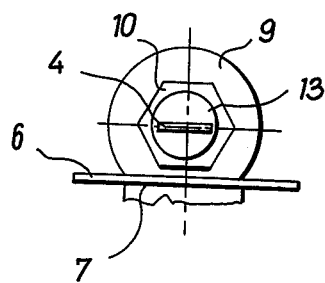
FIG. 2 is an end elevation of FIG. 1, with the outer anchor elements removed for clarity.

In the arrangement of FIG. 4, the cylindrical element 13 has been dispensed with and the flat spring 4 has been replaced by a round spring 61, to which the eccentric 9 may be directly secured. In addition, certain further details of the pressing elements associated with the element 1 are depicted. In particular, the peripheral region 57 of the eccentric 9 is shown in contact with a support element 5, which in turn abuts the above-mentioned insulating element 6. In addition, the bottom planar terminal 52 of the device 1 is shown as urged against the top surface of the heat sink 11 via a conductive pad 8 and a thin metal layer 12, which may be conventionally arranged to be in a liquid state at the operating temperatures of the element 1 in order to provide enhanced electrical and thermal contact. In all other respects, the arrangement of FIG. 4 is identical to that of FIGS. 1-3.

In FIG. 5, the operating member 10 of FIGS. 1-3 and 4 has been dispensed with, and the peripheral region 57 of the eccentric 9 is itself defined in hexagonal shape. In addition to permitting the element 9 to be turned about its axis without the necessity of the operating element 10, the planar segments of the eccentric periphery are effective to establish stable zones of bearing pressure to be applied against the particular type of semiconductive element 1 to be then secured by the depicted arrangement. For example, the periphery of the element 9 is shown as having a pair of flattened segments 62, 63, which are disposed on respectively opposite sides of the axis of the spring 61, and at different radial distances therefrom. As a result, the rotation of either of the opposed segments 62, 63 into spring-loaded contact with the support member 5 will establish a pair of stable zones for applying one of two different degrees of pressure against the underlying element 1.

In the foregoing, some illustrative arrangements of the invention have been described. Many variations and modifications will now occur to those skilled in the art. It is accordingly desired that the scope of the appended claims not be limited to the specific disclosure herein contained.

What is claimed is:

1. In an arrangement for adjustably urging a first surface of a planar semiconductive element disposed above a heat sink downwardly against the underlying heat sink, a pair of spaced anchor elements associated with the heat sink and projecting above a second opposite surface of the semiconductive element, an elongated resilient member extending transversely between and secured on opposite ends to the respective anchor elements above the second surface of the semiconductive element, eccentric means carried on the resilient member intermediate its ends above the second surface of the semiconductive element for rotation in a vertical plane against the biasing force of the resilient member, and means associated with the eccentric means for contacting the underlying second surface of the semiconductive element with a variable downward pressure corresponding to the rotation of the eccentric to correspondingly urge the first surface of the semiconductive element against the heat sink.

2. An arrangement as defined in claim 1, in which the resilient member is a flat spring having a first longitudinal axis.

3. An arrangement as defined in claim 1, in which the contacting means is defined by at least one peripheral region of the eccentric means.

4. An arrangement as defined in claim 1, in which the contacting means comprises an insulating spacer interposed between the periphery of the eccentric means and the second surface of the semiconductive element.

5. An arrangement as defined in claim 2, further comprising a hollow cylindrical element extending around and secured to the flat spring, and means for securing the outer surface of the cylindrical element to the eccentric means.

6. An arrangement as defined in claim 2, in which the eccentric means has first and second substantially planar peripheral regions disposed on respectively opposite sides of the first axis at different distances therefrom.

7. An arrangement as defined in claim 1, further comprising an operating member secured to the eccentric means for effecting rotation thereof against the biasing force of the resilient member.

* * * * *